(12) United States Patent
Okai et al.

(10) Patent No.: US 8,969,801 B2
(45) Date of Patent: Mar. 3, 2015

(54) SCANNING ELECTRON MICROSCOPE

(71) Applicant: Hitachi High-Technologies Corporation, Minato-ku, Tokyo (JP)

(72) Inventors: Nobuhiro Okai, Tokyo (JP); Yasunari Sohda, Tokyo (JP); Ritsuo Fukaya, Tokyo (JP); Zhigang Wang, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/351,900

(22) PCT Filed: Sep. 27, 2012

(86) PCT No.: PCT/JP2012/074924
§ 371 (c)(1),
(2) Date: Apr. 15, 2014

(87) PCT Pub. No.: WO2013/058077
PCT Pub. Date: Apr. 25, 2013

(65) Prior Publication Data
US 2014/0299769 A1    Oct. 9, 2014

(30) Foreign Application Priority Data
Oct. 20, 2011    (JP) .................. 2011-230221

(51) Int. Cl.
*H01J 37/28* (2006.01)
*H01J 37/244* (2006.01)
(52) U.S. Cl.
CPC .............. *H01J 37/28* (2013.01); *H01J 37/244* (2013.01); *H01J 2237/221* (2013.01); *H01J 2237/24485* (2013.01); *H01J 2237/2449* (2013.01); *H01J 2237/24578* (2013.01)
USPC .......... 250/310; 250/307; 250/311; 250/306; 250/397; 250/396 R
(58) Field of Classification Search
CPC ....... H01J 37/28; H01J 37/244; H01J 37/147; H01J 37/292; G01N 23/20058; G01N 23/203; G01N 23/22
USPC .............. 250/310, 307, 311, 306, 397, 396 R
See application file for complete search history.

(56) References Cited

U.S. PATENT DOCUMENTS 5,872,358 A * 2/1999 Todokoro et al. ............. 250/310
6,084,238 A * 7/2000 Todokoro et al. ............. 250/310
(Continued)

FOREIGN PATENT DOCUMENTS

JP    2002-110079    4/2002
WO   WO 00/19482    4/2000

*Primary Examiner* — David A Vanore
(74) *Attorney, Agent, or Firm* — Miles & Stockbridge P.C.

(57) ABSTRACT

To provide a scanning electron microscope that can detect reflected electrons of any emission angle, the scanning electron microscope, which obtains an image by detecting electrons from a sample (19) has: a control electrode (18) that discriminates between secondary electrons from the sample (19) and reflected electrons; a secondary electron conversion electrode (13) that generates secondary electrons by the impact of reflected electrons; a withdrawing electrode (12) that withdraws those secondary electrons; an energy filter (11) that discriminates between the secondary electrons withdrawn and electrons reflected from the sample (19); and a control calculation means (36) that selects a combination of voltages applied to the secondary electron conversion electrode (13), the withdrawing electrode (12), and energy filter (11).

18 Claims, 12 Drawing Sheets

(56) References Cited

U.S. PATENT DOCUMENTS

| | | | |
|---|---|---|---|
| 6,365,896 B1 * | 4/2002 | van der Mast | 250/310 |
| 6,444,981 B1 * | 9/2002 | Todokoro et al. | 250/310 |
| 6,501,077 B1 * | 12/2002 | Sawahata et al. | 250/310 |
| 6,512,228 B2 * | 1/2003 | Todokoro et al. | 250/310 |
| 6,555,819 B1 * | 4/2003 | Suzuki et al. | 250/311 |
| 6,580,074 B1 * | 6/2003 | Sato et al. | 250/310 |
| 6,787,772 B2 * | 9/2004 | Ose et al. | 850/9 |
| 6,885,001 B2 * | 4/2005 | Ose et al. | 850/9 |
| 7,075,078 B2 * | 7/2006 | Ose et al. | 250/311 |
| 7,459,681 B2 * | 12/2008 | Arai et al. | 250/306 |
| 7,655,906 B2 * | 2/2010 | Cheng et al. | 250/307 |
| 7,705,302 B2 * | 4/2010 | Aoki et al. | 250/310 |
| 8,431,893 B2 * | 4/2013 | Fukuda et al. | 250/306 |
| 8,624,186 B2 * | 1/2014 | Wang et al. | 250/310 |
| 8,759,761 B2 * | 6/2014 | Doi | 250/306 |
| 2003/0122074 A1 * | 7/2003 | Suzuki et al. | 250/310 |
| 2004/0036021 A1 * | 2/2004 | Todokoro et al. | 250/310 |
| 2004/0089805 A1 * | 5/2004 | Todokoro et al. | 250/310 |
| 2004/0113074 A1 * | 6/2004 | Suzuki et al. | 250/310 |
| 2004/0188612 A1 * | 9/2004 | Ose et al. | 250/310 |
| 2011/0139983 A1 * | 6/2011 | Doi | 250/307 |
| 2011/0260055 A1 * | 10/2011 | Wang et al. | 250/307 |
| 2012/0298863 A1 * | 11/2012 | Yamazaki et al. | 250/307 |
| 2013/0126733 A1 * | 5/2013 | Fukuda et al. | 250/310 |
| 2013/0141563 A1 * | 6/2013 | Setoguchi et al. | 348/79 |
| 2014/0014836 A1 * | 1/2014 | Isawa et al. | 250/310 |
| 2014/0299769 A1 * | 10/2014 | Okai et al. | 250/310 |

* cited by examiner

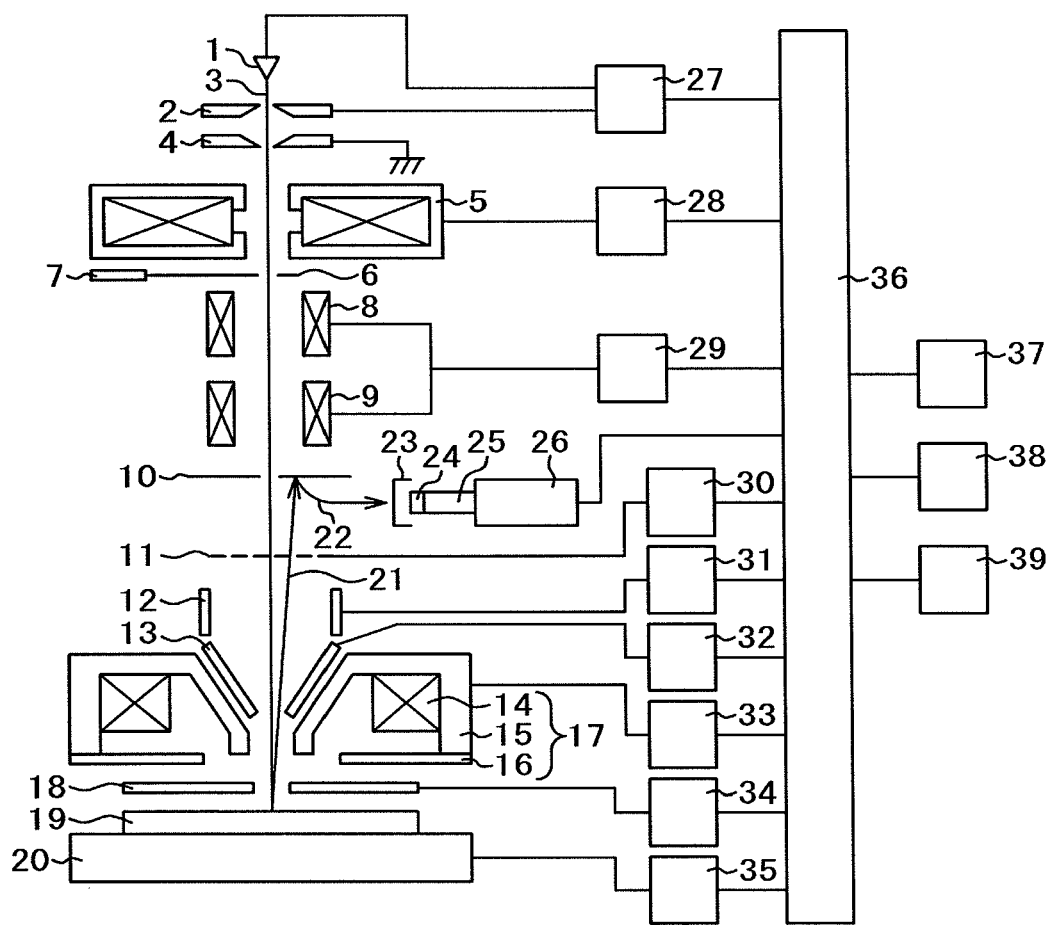
F I G . 1

(POTENTIAL OF CONTROL ELECTRODE) − (POTENTIAL OF SAMPLE)

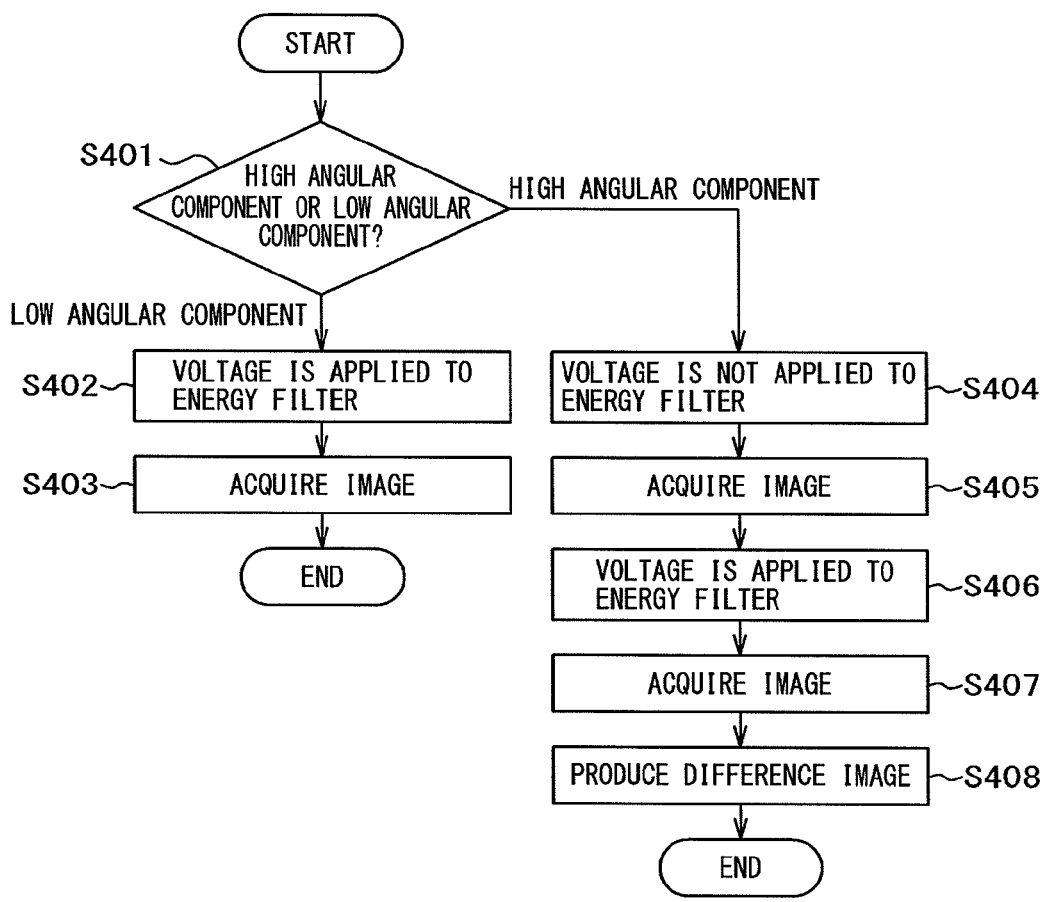

FIG. 15
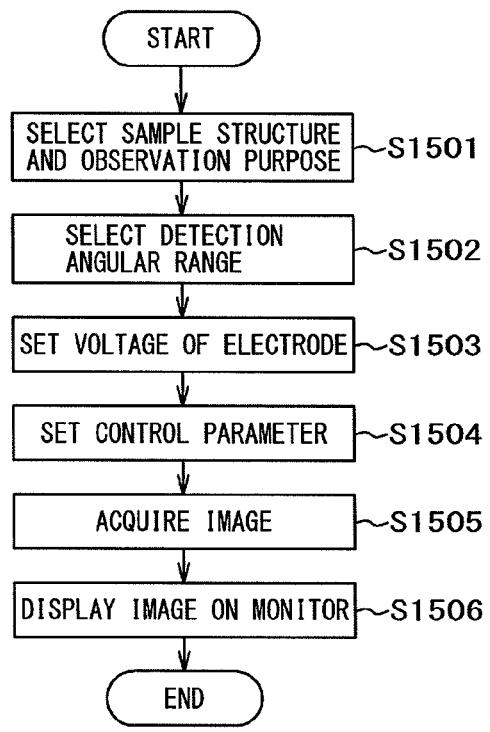
FIG. 16A    FIG. 16B
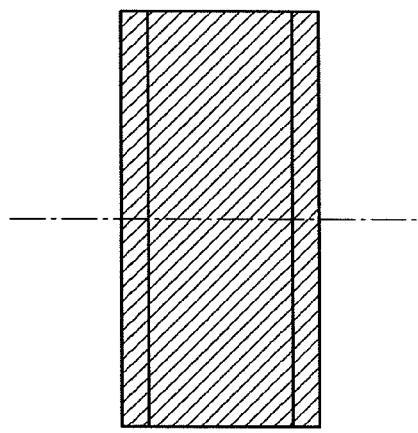 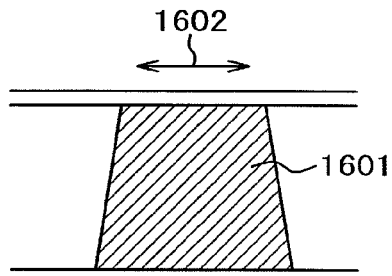

F I G . 1 9
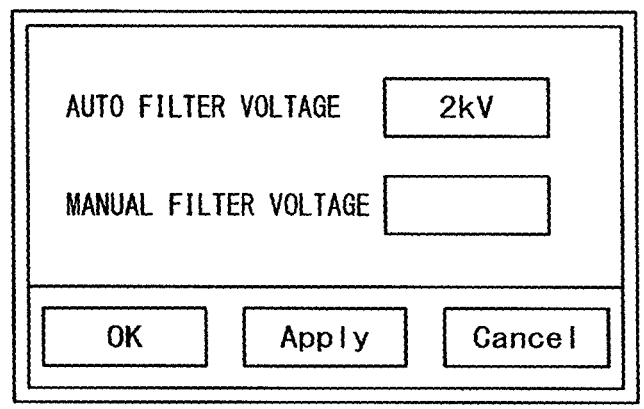

SCANNING ELECTRON MICROSCOPE

TECHNICAL FIELD

The present invention relates to a scanning electron microscope which irradiates a sample surface with an electron beam to detect a secondary signal generated from the sample for obtaining a two-dimensional scanned image representing a shape or a composition of the sample surface.

BACKGROUND ART

The scanning electron microscope is configured to provide a two-dimensional scanned image, which accelerates the electron emitted from an electron source of acceleration type or field emission type to form a thin electron beam (primary electron beam) using an electrostatic lens or an electromagnetic lens, two-dimensionally scans the primary electron beam on the sample to be observed to detect a secondary signal such as secondary electron and reflected electron, that is secondarily generated from the sample irradiated with the primary electron beam, and inputs strength of the detected signal in the display unit such as cathode-ray tube through brightness modulation, which is scanned synchronously with scanning of the primary electron beam.

The secondary signal generated from the sample through the primary electron beam radiation has a wide energy distribution. For example, some of the primary electrons incident on the sample may be elastically scattered by the atom on the solid surface to jump out from the sample surface. Such electron is called a reflected electron which exhibits energy equal to or higher than that of the primary electron beam to a certain degree. Some of the primary electrons incident on the sample may interact with the atom inside the sample. The electron inside the sample is excited and supplied with kinetic energy so as to be released outside, which is called a secondary electron exhibiting energy ranging from approximately 0 eV to 50 eV.

The secondary electron and the reflected electron inherently contain individual unique information owing to different cause of sources. The secondary electron with low energy is allowed to escape from the sample surface only with small depth. This may provide the microstructure of the sample surface with high resolution. The reflected electron with high energy exhibits elevation angular components in various directions. The sample information at each of the respective elevation angles is different. In an explanation described herein, the elevation angle of the reflected electron will be defined as the angle formed between the optical axis of the radiated primary electron beam and an emission direction of the reflected electron from the sample surface. The reflected electron at high elevation angle (high angular component) contains relatively larger volume of surface information in addition to the inside information and the composition information. The secondary electron has a feature of high edge contrast. However, there is an advantage of providing the surface information by observing the reflected electron at the large elevation angle while suppressing the edge contrast. The reflected electron at the small elevation angle (low angular component) provides insufficient information about the sample surface, but is sensitive to the composition information. The secondary electron and the reflected electron emitted from the sample have the aforementioned sample information. Therefore, conventionally, the required sample information is obtained by selecting the secondary electron signal or the reflected electron signal depending on the sample to be observed for acquiring the image with the emphasized information.

The object to be observed by the scanning electron microscope is widely ranged from the semiconductor device to the biological sample. Mostly, the secondary electron image has been used for observation and measurement of the semiconductor device. As the sample shape has been getting complicated, the demand of using the reflected electron signal is increased to obtain the sample information suitable for the object. The number of the reflected electrons emitted from the sample is smaller than that of the secondary electrons by 1/5 or less. Additionally, the high kinetic energy of the reflected electron may interfere with control of the orbit by the electrode. The generally employed scanning electrode microscope is structured that most of the reflected electrons will impinge on the electrode and wall surfaces of the apparatus before reaching the detector, which cannot be detected. For that reason, the reflected electron image provides insufficient S/N for observation and measurement compared with the secondary electron image. Patent Literature 1 discloses the technique for solving the aforementioned problem, which includes a secondary electron conversion electrode that generates the secondary electrons by the impact of the reflected electrons, and a withdrawing electrode that withdraws the secondary electrons generated by the secondary electron conversion electrodes to efficiently detect the reflected electron generated from the sample at the low angle so as to improve the detection rate of the reflected electron higher than the generally employed case. Patent Literature 2 discloses the technique for generating the sample signal optimally suitable for the observation target by improving the detection rate of the reflected electron using the same structure of the apparatus as the one disclosed in Patent Literature 1, and adding three kinds of secondary signals each containing different sample information (secondary electron, low angular reflected electron, high angular reflected electron) at the respective ratios.

CITATION LIST

Patent Literature

Patent Literature 1: WO00/19482
Patent Literature 2: JP-A-2002-110079

SUMMARY OF THE INVENTION

Technical Problem

The aforementioned related art enables the scanning electron microscope to improve the detection rate of the reflected electrons. The ratio between the secondary electron signal and the reflected electron signal to be added is varied in accordance with the sample to be observed so as to obtain the image that matches the observation target.

The inventors studied on the specific information expected to be observed with respect to the sample with the hole having the sectional structure as shown in FIG. 5A as an example by use of the reflected electrons and the secondary electrons.

FIGS. 5A to 5D represent an example of the difference in profile in accordance with selection of the signal electron to be obtained. It is assumed that the sample has a deep hole or a deep groove. The secondary electrons and the reflected electrons are emitted at various elevation angles from the sample irradiated with the electron beam. As the secondary electron exhibits low energy, it is likely to be influenced by the external electric field as shown in FIG. 5A. Under the voltage condition of retarding method employed especially for improving the resolution, the electron is withdrawn from the sample under the retarding field, and detected. FIG. 5B shows the line profile having a peak around the edge of the hole, which occurs due to the edge effect where a large number of secondary electrons are emitted from the edge part of the pattern. The peak called white band is used for measuring the hole dimension. The contrast between the top part and the bottom part of the pattern depends on the emission efficiency of the secondary electrons at the respective materials of the parts. As the reflected electron exhibits sufficiently high energy, among the reflected electrons generated at the bottom part, those with high angular components impinge on the side surface before they are withdrawn under the retarding field, thus failing to escape from the hole (see FIG. 5C). Meanwhile, the reflected electron emitted from the top part is allowed to have all the elevation angular components to be emitted outside the sample. The image acquired based on the thus generated reflected electron signal may provide the contrast corresponding to the differences in the reflected electron emission efficiency and the detection rate between the top part and the bottom part (see solid line of FIG. 5D). Selection of the reflected electrons for detection except the angular component that cannot be detected at the bottom part may remove the influence of the difference in the detection rate owing to the sample structure, thus providing the pure material contrast between the top part and the bottom part. Generating the image by obtaining only the elevation angular component that cannot be detected at the bottom part may provide the image having the contrast between the top part and the bottom part emphasized (see dashed line of FIG. 5D). If observation of the pattern shape of the bottom part structure, if any, is desired, the slight angular component is only detected to allow the observation by emphasizing the pattern shape of the bottom part. In this way, the reflected electron at the specific angle is selected and detected to allow emphasis on the material contrast and clear pattern shape. The study has clarified that the process of arbitrary selection and detection of the emission angle of the reflected electron is effective to cope with diversification of the sample structure to be observed, and the observation target.

The related art as described above classifies the emission angle of the reflected electron to be detected into two types, that is, the high angle and the low angle, and discloses no technique to select and detect the reflected electron at arbitrary emission angle. According to Patent Literature 1, the secondary electron deflector is used for discriminating between the secondary electrons generated by the low and high angular reflected electrons. As the secondary electron generated by the high angular reflected electron is accelerated by the withdrawing electrode, the resultant energy difference between those generated by the high and low angular reflected electrons is small. Even if deflection of only the secondary electrons is desired, the low angular reflected electrons are also deflected, thus reducing the detection rate.

The present invention is made to solve the aforementioned problems. It is therefore an object of the present invention to provide the scanning electron microscope that allows detection of the reflected electron at an arbitrary emission angle in accordance with the shape and material of the sample.

Solution to Problem

For the purpose of solving the aforementioned problem, the scanning electron microscope is configured to dispose a control electrode between the objective lens and the sample, the secondary electron conversion electrode between the upper magnetic pole of the objective lens and the detector for generating the secondary electron by the impact of the reflected electron, the withdrawing electrode for withdrawing the secondary electron, and the energy filter. The combination of voltages applied to the secondary electron conversion electrode, the withdrawing electrode and the energy filter is selected to control the detection angular range of the reflected electron. The angular range detected by an operator is selected to automatically select the voltage value determined for the secondary electron conversion electrode and the withdrawing electrode, and the control parameter under the corresponding image pickup condition in reference to the control table.

Advantageous Effect of Invention

The present invention is capable of providing the scanning electron microscope to provide the image by arbitrarily selecting the angular range of the reflected electron to be detected in accordance with the shape and material of the sample.

BRIEF DESCRIPTION OF DRAWINGS

FIG. 1 is a schematic view of a scanning electron microscope according to a first embodiment.

FIG. 4 is a flowchart of the process executed in the scanning electron microscope according to the first embodiment for acquiring the image by discriminating between high and low angular components of the reflected electrons through the energy filter.

FIG. 15 is a flowchart of the process for acquiring the image by use of the scanning electron microscope according to the third embodiment by setting the sample structure and the observation target.

FIGS. 16A and 16B represent the structure of the sample employed in a fourth embodiment, wherein FIG. 16A is a top view and FIG. 16B is a sectional view.

FIG. 19 illustrates an interface of the scattering electron microscope according to the fourth embodiment.

DESCRIPTION OF EMBODIMENTS

Figure 2A:
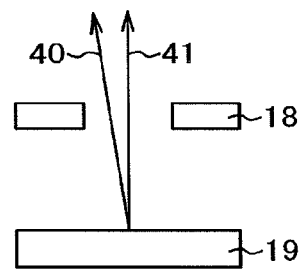
FIG. 2A is a view representing discrimination between the secondary electron and the reflected electron under voltage control performed by the control electrode, illustrating orbits of the secondary and reflected electrons when the potential difference between the control electrode and the sample is zero or the control electrode is at more electropositive potential compared with the sample.
Figure 2B:
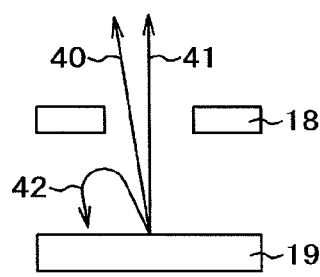
FIG. 2B is a view representing discrimination between the secondary electron and the reflected electron under voltage control performed by the control electrode, illustrating orbits of the secondary and reflected electrons when the control electrode is at more electronegative potential compared with the sample.

Embodiments of the present invention will be described referring to the drawings.

First Embodiment

FIG. 1 is a schematic view of a scattering electron microscope according to a first embodiment of the present invention. This embodiment is intended to perform length measurement and inspection of the wiring on the large-sized sample such as a semiconductor wafer using energy of the primary electron beam set as the low incident energy ranging from several hundreds eV to several keV. This embodiment applies to the electron microscope with the similar structure irrespective of different sample and target, or larger incident energy.

The voltage and current in the apparatus are set by the control calculation unit 36 for the entire apparatus, which reads conditions stored in a control table 39 using the respective control units 27 to 35. If the operator commands to change the measurement condition, the control table is automatically read for changing the control parameter. The reference numeral 27 denotes an electron gun control unit, a reference numeral 28 denotes a condenser lens control unit, a reference numeral 29 denotes a scanning deflector control unit, a reference numeral 30 denotes an energy filter control unit, a reference numeral 31 denotes a withdrawing electrode control unit, a reference numeral 32 denotes a secondary electron conversion electrode control unit, a reference numeral 33 denotes an objective lens control unit, a reference numeral 34 denotes a control electrode control unit, and a reference numeral 35 denotes a sample voltage control unit. The same reference signs represent the same constituent elements.

Application of extraction voltage between a field emission cathode 1 and an extraction electrode 2 generates an emitted electron 3 which is further accelerated between the extraction electrode 2 and an anode 4 at the ground potential. Energy of the electron beam that has passed through the anode 4 matches the accelerating voltage of an electron gun (including the field emission cathode 1 and the extraction electrode 2). The primary electron beam that has passed through the anode 4 is subjected to scanning deflection through a condenser lens 5, an upper scanning deflector 8, and a lower scanning deflector 9, and is narrowed to be thin on the sample through an objective lens 17. The objective lens 17 includes an objective lens coil 14, an upper magnetic pole 15 and a lower magnetic pole 16, and leaks the magnetic field generated at the objective lens coil 14 from the gap between the upper and the lower magnetic poles so as to be concentrated on an optical axis for electron beam convergence. Intensity of the electromagnetic lens is adjusted by changing amperage of the objective lens coil 14. The primary electron beam that has passed through the objective lens 17 is decelerated in the retarding field between the objective lens 17 and the sample 19 so that the electron beam reaches the sample 19. For this structure, the energy of the primary electron upon passage through the objective lens 17 is higher than the energy incident on the sample 19. In comparison with the case where the primary electron beam with energy is finally allowed to pass through the objective lens 17, the chromatic aberration at the objective lens 17 is lessened to provide the thinner electron beam, resulting in high resolution. An opening angle of the primary electron beam of the objective lens 17 is determined in accordance with a diaphragm 6 located below the condenser lens 5. Centering of the diaphragm 6 is performed by an adjustment knob 7. Referring to the drawing, the mechanical adjustment is conducted. However, the electrostatic deflectors or the magnetic field deflectors are disposed at the head and end of the diaphragm 6 so as to deflect the electron beam for adjustment. The electron beam that has been narrowed to be thin through the objective lens 17 is scanned on the sample by the upper scanning deflector 8 and the lower scanning deflector 9. At this time, the respective deflecting directions and intensities of the upper scanning deflector 8 and the lower scanning deflector 9 are adjusted so that the scanned electron beam constantly passes through the center of the objective lens 17. The sample 19 is fixed onto a sample holder 20.

Irradiation of the sample 19 with the primary electron beam generates the secondary electron and the reflected electron 21. The retarding field between the objective lens 17 and the sample 19 serves as the accelerating electric field for the secondary electron and the reflected electron 21 generated at the sample 19. It is sucked into the passage of the objective lens 17 to rise under the magnetic field thereof while being acted upon by the lens. The accelerated secondary electrons and reflected electrons 21 impinge on an electrode (conversion electrode) 10. This may further generate the secondary electrons 22 which are sucked in a lateral electric field of a suction electrode 23 between the objective lens 17 and the lower scanning deflector 9, and accelerated by a scintillator 24 to which positive voltage, for example, high voltage of 10 kV is applied after passing through the mesh of the suction electrode 23. The scintillator 24 is then lit. The emitted light is guided to a photomultiplier 26 by a light guide 25, and converted into an electric signal. The output of the photomultiplier 26 is further amplified into a brightness modulation input signal which is formed as an image. It is displayed on a monitor 38 and stored in a recording unit 37. The scanning electrode microscope according to the embodiment is featured by a control electrode 18 disposed between the sample 19 and the objective lens 17, a secondary electron conversion electrode 13, a withdrawing electrode 12 and an energy filter 11 disposed between the objective lens 17 and the lower scanning deflector 9. The respective functions of the featured elements will be described referring to FIGS. 2A to 2D, and FIGS. 3A and 3B.

Figure 2C:
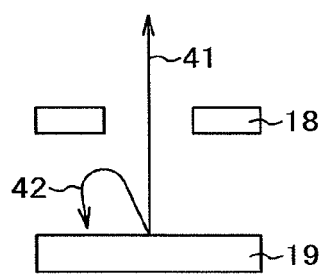
FIG. 2C is a view representing discrimination between the secondary electron and the reflected electron under voltage control performed by the control electrode, illustrating orbits of the secondary and reflected electrons when the control electrode has sufficiently high electronegative potential compared with the sample.
Figure 2D:
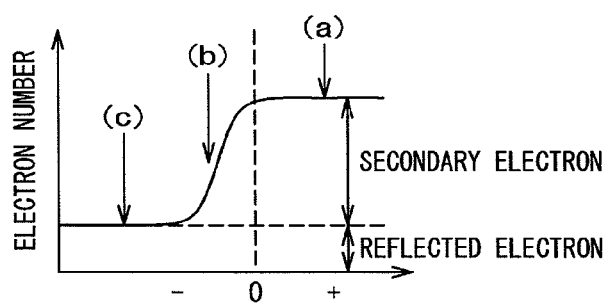
FIG. 2D is a view representing discrimination between the secondary electron and the reflected electron under voltage control performed by the control electrode, illustrating the plotted number of electrons obtained when changing the potential difference between the control electrode and the sample.

FIGS. 2A to 2D are views which explain the function for discriminating between the secondary electron and the reflected electron by the control electrode 18. Irradiation of the sample 19 with the primary electron beam generates a secondary electron 40 and a reflected electron 41. If the potential difference between the control electrode 18 and the sample 19 is 0 or the control electrode 18 is at more electropositive potential compared with the sample 19, both the secondary electron 40 and the reflected electron 41 pass through the hole at the center of the control electrode 18. If the control electrode 18 is slightly at more electronegative potential compared with the sample 19, the reflected electron 41 with high energy passes through the hole at the center of the control electrode. Meanwhile, a part 42 of the secondary electron 40 with low energy is returned to the sample by a potential barrier formed just above the sample. In the case where the control electrode 18 is sufficiently at more electronegative potential compared with the sample 19, the reflected electron 41 with high energy passes through the hole at the center of the control electrode 18 as FIG. 2C shows. Meanwhile, the secondary electron 42 with low energy is entirely returned to the sample 19. FIG. 2D shows an example derived from plotting the electron numbers passing through the control electrode 18 upon change in the potential difference between the control electrode 18 and the sample 19. As the potential difference between the control electrode 18 and the sample 19 is increased to the negative side, the electron number sharply reduced. The reduced component corresponds to the secondary electron component with low energy, which has been returned to the sample 19 by the potential barrier formed just above the sample. The remained offset component corresponds to the reflective electron component with high energy. Accordingly, the electron numbers are plotted by changing the potential difference between the control electrode 18 and the sample 19 to form a graph as shown in FIG. 2D. Based on the graph, the potential difference is set, which makes it possible to select one of options including acquisitions of both the secondary electron and the reflected electron, part of the secondary electron and the reflected electron, and only the reflected electron. The relationship between the potential difference and the electron number shown in FIG. 2D depends on the shape of the control electrode 18. For example, an expanded diameter of the hole at the center of the control electrode increases the potential difference required for generating the potential barrier on the optical axis to return the secondary electron to the sample. Therefore, the graph shifts to the negative side. Accordingly, if the shape of the control electrode 18 is changed, it is necessary to confirm the voltage condition required for discrimination between the secondary electron and the reflected electron in reference to the graph obtained as shown in FIG. 2D.

The magnetic head of the hard disk may be the sample for improving the S/N of the image by returning the secondary electron emitted from the sample and detecting only the reflected electron using the control electrode. The magnetic head sample is configured by applying a thin film of DLC (Diamond-Like Carbon) with several nano meters onto the planarized pattern. When the image of the secondary electron is observed, a rough flaw formed upon the surface planarization through CMP (Chemical Mechanical Polishing) is emphasized by the edge effect, thus deteriorating the contrast of the pattern part. Furthermore, charging of the surface by radiation of the electron beam bends the orbit of the secondary electron, which may deform the image. On the contrary, if the image is formed through detection of the reflected electron with higher energy than the secondary electron, it is not influenced by charging of the sample. Accordingly, the image is not deformed, and small edge effect seen with the secondary electron image facilitates observation of the pattern contrast. This structure allows strict discrimination between the secondary electron and the reflected electron, which eliminates contribution of the secondary electron to the reflected electron image. Existence of even a small number of secondary electrons may deteriorate the image quality owing to the action as described above. As a result, the scanning electron microscope provided with the control electrode is suitable for observation of the magnetic head of the hard disk.

The method for detecting the reflected electron will be described referring to FIGS. 3A and 3B. As the reflected electron with high energy is not largely acted upon by the deflection of the orbit by the electrode, most of them impinge on the electrode and the inner wall inside the apparatus before reaching the detector (electrode (conversion electrode) 10 in this embodiment). A reflected electron 43 (low angular component) emitted from the sample 19 at the small elevation angle impinges on the electrode (conversion electrode) 10 to generate a secondary electron 44. The generated secondary electron 44 is sucked in the lateral electric field of the suction electrode 23, and detected. Meanwhile, a reflected electron 45

(high angular component) emitted at the large elevation angle impinges on the secondary electron conversion electrode 13 to generate a secondary electron 46. The generated secondary electron 46 is withdrawn and accelerated by the potential difference between the secondary electron conversion electrode 13 and the withdrawing electrode 12, and impinges on the electrode (conversion electrode) 10 to further generate a secondary electron 47. The generated secondary electron 47 is sucked and detected in the lateral electric field of the suction electrode 23. Accordingly, it is necessary to set the secondary electron conversion electrode 13 to be negative so that the secondary electron is apart therefrom, and withdrawn by bringing the voltage of the withdrawing electrode 12 to more positive side compared with the secondary electron conversion electrode 13 for the purpose of detecting the high angular reflected electron 45 which impinges on the secondary electron conversion electrode 13.

Figure 3A:
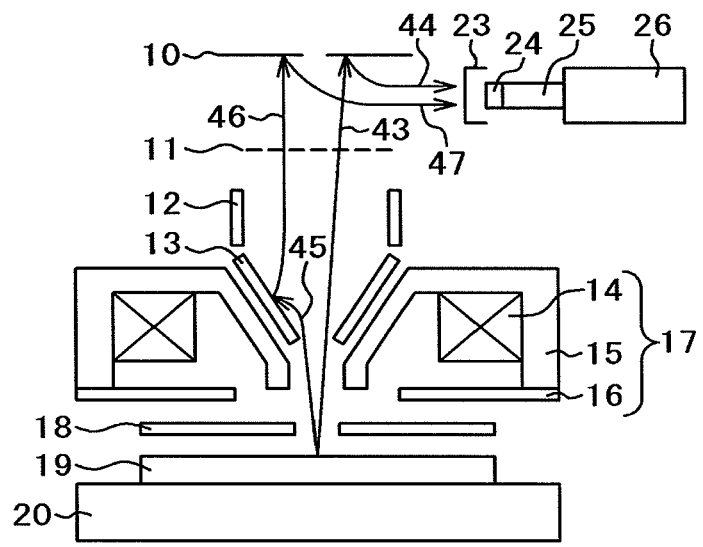
FIG. 3A is a schematic view of the apparatus structure shown in FIG. 1, configured to detect the reflected electron, illustrating the orbit of the reflected electron when the negative voltage is not applied to the energy filter.
Figure 3B:
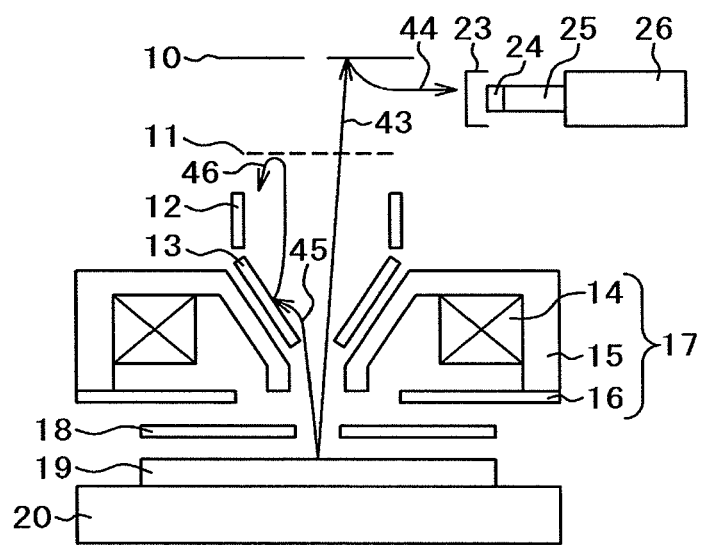
FIG. 3B is a schematic view of the apparatus structure shown in FIG. 1, configured to detect the reflected electron, illustrating the orbit of the reflected electron when the negative voltage is applied to the energy filter.

The structure shown in FIG. 3A detects the reflected electron (low angular component) emitted at the smaller elevation angle and the reflected electron (high angular component) emitted at the larger elevation angle simultaneously. This embodiment employs the energy filter for discriminating between the low angular component and the high angular component which are simultaneously detected. The low angular component exhibits energy equivalent to or relatively higher than that of the incident electron beam to a certain degree. Meanwhile, the secondary electron generated from the secondary electron conversion electrode 13 rather than the reflected electrode is detected as the high angular component. The secondary electron exhibits the energy equivalent to the potential difference between the secondary electron conversion electrode 13 and the ground potential, which is lower than the energy of the reflected electron generated from the sample 19. The energy filter 11 is provided on the advancing axis of the electron for discrimination between those electrons. The energy filter 11 has a mesh to which the negative voltage is applied to allow transmission of the electron with energy higher than the potential to be formed, and allow no transmission of the electron with low energy so as to provide the effect for discrimination between electrons with different energy values. The energy filter 11 may be configured to include not only the mesh as described above but also the function capable of discriminating between the electrons with different energy values. The embodiment is configured to set the voltage of the energy filter 11 to be lower than that of the secondary electron conversion electrode 13 so that the secondary electron 46 generated from the secondary electron conversion electrode 13 is not allowed to transmit through the energy filter 11. Therefore, it is not detected (FIG. 3B). The use of the energy filter 11 allows discrimination between the high angular component and the low angular component. Furthermore, the energy filter is disposed on the advancing axes of the secondary electron 46 and the reflected electron 43 generated from the secondary electron conversion electrode 13. This makes it possible to prevent lowering of the detection rate without changing the orbit of the transmitting electrons through the voltage application.

FIG. 4 represents the flowchart of the process for discriminating between the high angular component and the low angular component of the reflected electron through the energy filter 11. It is judged whether the image to be acquired corresponds to the high angular component or the low angular component (S401). If the image corresponding to the low angular component is acquired, voltage is applied to the energy filter 11 to remove contribution of the high angular component (S402) to acquire the image (S403). Meanwhile, when acquiring the image corresponding to the high angular component, images are obtained in the state where no voltage is applied to the energy filter 11 (S404, S405), and then obtained by applying the voltage to the energy filter 11 (S406, S407). Finally, a difference image between two images obtained in S405 and S407 is generated to acquire the image corresponding to the high angular component (S408). The time required for acquiring those two images is short, and accordingly, fluctuation in the reflected electron emitted from the sample is ignorable. In this embodiment, two conditions of application and non-application of voltage to the energy filter 11 are employed. Alternatively, two images may be acquired under the conditions where different voltages are applied so as to generate the difference image.

The distribution of emitting angles of the low and high angular components of the reflected electrons will be described.

Figure 6:
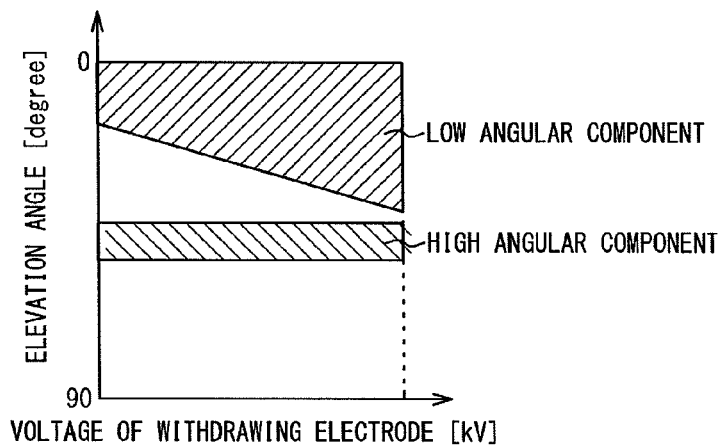
FIG. 6 is a view representing the angular distribution of the reflected electron detectable upon change in the voltage of the withdrawing electrode of the scanning electron microscope according to the first embodiment.

FIG. 6 shows the angular components of the reflected electron which is detected when the voltage of the withdrawing electrode 12 is electropositively changed in the state where the secondary electron conversion electrode 13 is kept at the constant negative voltage. An area indicated with hatched lines down to the left denotes the detected angle with low angular component, and an area indicated with hatched lines down to the right denotes the detected angle with high angular component. For the low angular component, the voltage of the withdrawing electrode 12 is brought into the electropositively large state. In other words, as the potential difference between the secondary electron conversion electrode 13 and the withdrawn electrode 12 is increased, the detected angle range becomes large. This is caused by the action of the secondary electron conversion electrode 13 and the withdrawing electrode 12 which serve as the electrostatic lens to converge the orbit of the reflected electron. Meanwhile, for the high angular component, the reflected electrons in the predetermined angular range are only detected without depending on the voltage of the withdrawing electrode 12. This is because the angular distribution of the reflected electron that impinges on the secondary electron conversion electrode 13 does not depend on the voltage of the withdrawing electrode 12.

Figure 7:
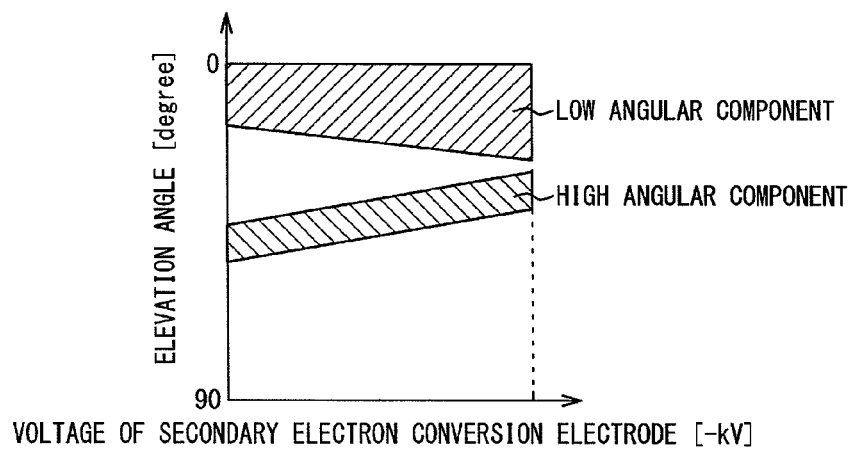
FIG. 7 is a view representing the angular distribution of the reflected electron detectable upon change in the voltage of the secondary electron conversion electrode of the scanning electron microscope according to the first embodiment.
Figure 8:
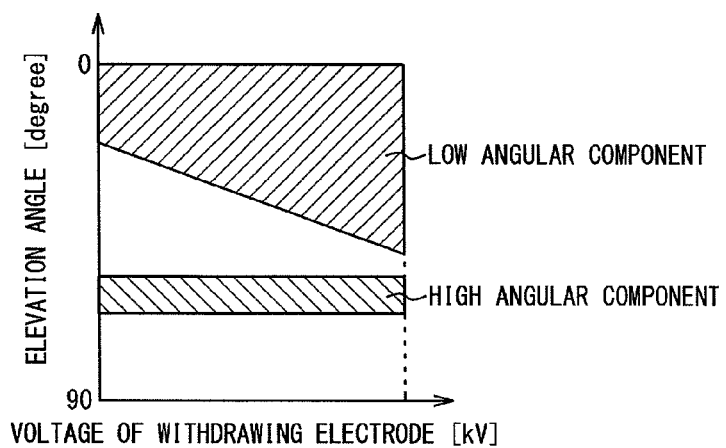
FIG. 8 is a view representing the angular distribution of the reflected electron detectable when the incident energy of the primary electron beam is lowered under the same conditions as those shown in FIG. 6.

FIG. 7 shows the distribution of detected angles when increasing the voltage of the secondary electron conversion electrode 13 to the negative side while fixing the withdrawing electrode 12 to the steady positive voltage. Unlike the distribution shown in FIG. 6, for both the low and high angular components, the angular range to be detected varies by changing the voltage of the high angular component as well as the low angular component. The low angular component may be detected to the large angle as it is increased to the negative side. Meanwhile, the high angular component is allowed to detect the reflected electron at smaller angle while keeping the steady angular range. As a result, the angular distribution of the low angular component may be varied by changing the voltage of the withdrawing electrode 12. The angular distributions of the low and high angular components may be varied by changing the voltage of the secondary electron conversion electrode 13. The angular distribution of the reflected electron to be detected depends not only on the voltages of the withdrawing electrode 12 and the secondary electron conversion electrode 13, but also on shapes and positions of those electrodes. The angular distribution also depends on the incident energy of the primary electron beam to the sample 19. FIG. 8 shows the angular distribution of the reflected electrons detected when changing the voltage of the withdrawing electrode 12 by reducing the incident energy by half. Compared with the case of high incident energy, the low angular component allows detection up to the larger angle even if the same positive voltage is applied to the withdrawing electrode 12. Meanwhile, the detectable angular range of the high angular component is similar to that of the case of the high incident energy. However, the high angular component shifts to the high angular side.

Figure 9:
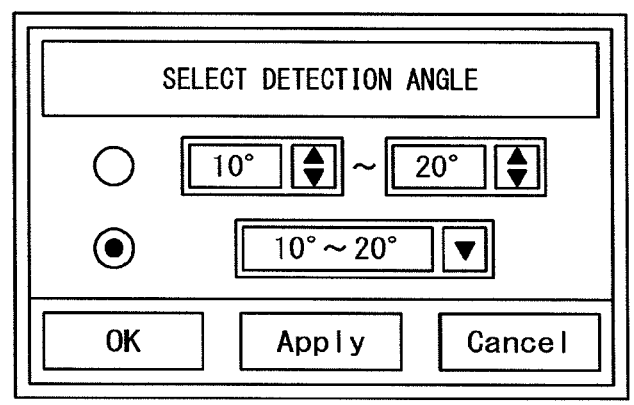
FIG. 9 is a view illustrating an example of a GUI for setting the angle of the reflected electron to be detected by use of the scanning electron microscope according to the first embodiment.
Figure 10:
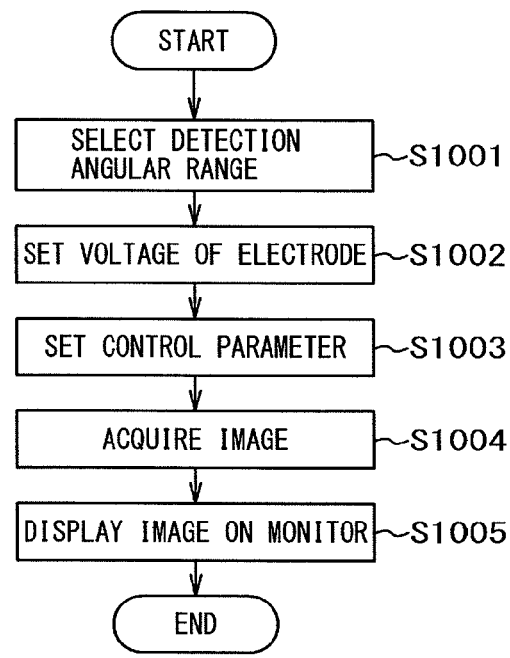
FIG. 10 is a flowchart of the process for acquiring the image by setting the angle of the reflected electron detected by use of the scanning electron microscope according to the first embodiment.

When activating the apparatus, the detection angle maps as shown in FIGS. 6 to 8 are generated for the voltage condition of each electrode so that the relationship between the detectable angular range and the voltage is stored in the control table 39. The detection angle map upon change in the incident energy and the voltage of each electrode may be generated based on simulation results using calculations of electromagnetic field and electron orbit. Alternatively, such map may be generated based on the experimental results. FIG. 9 illustrates an example of a GUI (Graphical User Interface) through which an operator commands the detection angle of the reflected electron. FIG. 10 shows a flowchart of the process for acquiring the image upon selection of the detection angle through the GUI. The GUI is displayed on the monitor 38, on which the operator executes the scan. The angular range may be directly designated, or the operator is allowed to select the optimum angular range from combinations of the preliminarily designated angular ranges. Firstly, the operator selects the desired detection angular range on the GUI as shown in FIG. 9 (S1001). Then the apparatus automatically reads each voltage of the respective electrodes within the detection angular range from the control table 39, and automatically selects the predetermined voltage values. The selected values are set for the secondary electron conversion electrode 13, the withdrawing electrode 12 and the energy filter 11 (S1002). Change in the voltages for the respective electrodes varies the optical condition of the primary electron beam and the detection rate of the reflected electron. If the image is intended to be observed, such image may be directly acquired after changing voltages for the respective electrodes. If the scanning electron microscope is used for measuring the length of the pattern for the semiconductor device, change in the optical condition may influence the measurement accuracy. Especially, the different deflection amount of the primary electron beam may change the magnification. There may be the risk of calculating the value different from the originally measured length of the pattern. Accordingly, the apparatus automatically sets control parameters of the image pickup condition such as deflection amount after changing the voltages for the respective electrodes, which have been read from the control table 39 (S1003). Thereafter, the image is acquired and stored in the recording unit 37 (S1004). Finally, the acquired image is displayed on the monitor 38 (S1005).

Figure 11:
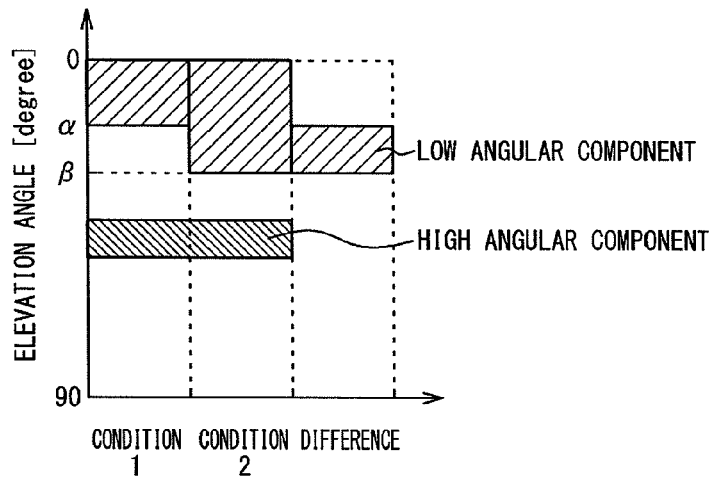
FIG. 11 is a view representing an example of the angular distribution of the reflected electrons obtained under two different voltage conditions by use of the scanning electron microscope according to the first embodiment, and the angular distribution derived from the difference in the reflected electrons.
Figure 12:
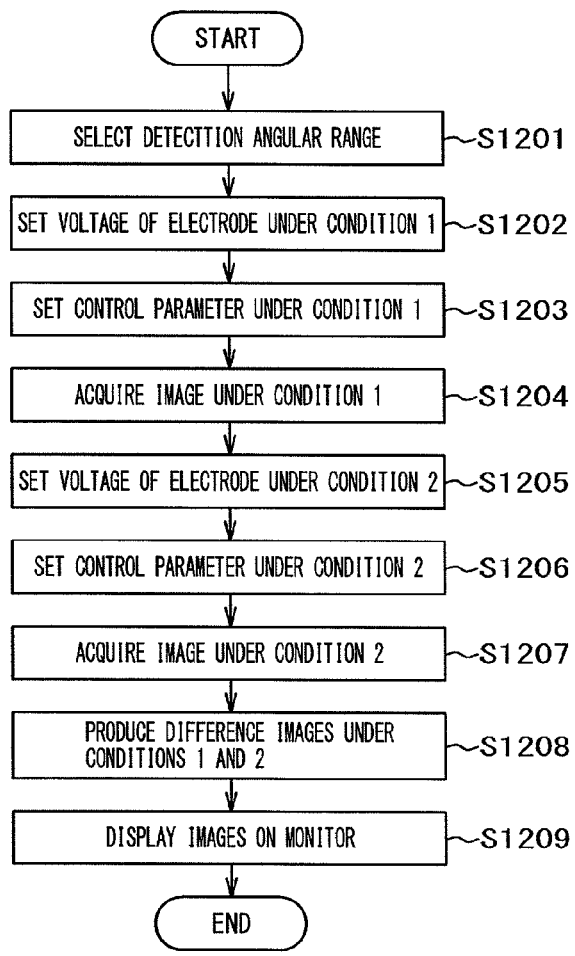
FIG. 12 is a flowchart of the process for generating a difference image of two images acquired under two different voltage conditions by use of the scanning electron microscope according to the first embodiment.

The technique for changing the voltage applied to the withdrawing electrode and the secondary electron conversion electrode, and the incident energy as shown in FIGS. 6 to 8 is applicable to acquire the reflected electron image with arbitrary angular component. As for the high angular component, use of the technique allows acquisition of the reflected electron image with the arbitrary angular component. As for the low angular component, the reflected electrons in the range from 0° to the specific angle may be detected for the structural reason of the apparatus. The reflected electron only in the specific angular range among those detectable with respect to the low angular component may be obtained by acquiring a difference image between the images generated under the multiple different voltage conditions. FIG. 11 shows the detection angular ranges obtained under two voltage conditions, and the difference therebetween. FIG. 12 shows a flowchart of the process for acquiring the difference image. The voltage conditions 1 and 2 represent the detection angles obtained when applying positive voltage to the withdrawing electrode while applying the negative voltage to the secondary electron conversion electrode. Likewise the case shown in FIG. 6, the area with hatched lines down to the left denotes the detection angle of the low angular component, and the area with hatched lines down to the right denotes the detection angle of the high angular component. Compared with the voltage condition 1, the voltage condition 2 applies high voltage to the withdrawing electrode 12 so as to obtain the image in the wide angular range. The high angular component has the same angular distribution both under the voltage conditions 1 and 2. Meanwhile, the low angular component has different detection angular distributions. Under the voltage condition 1, the reflected electron in the angular range from 0° to $\alpha°$ may be detected. Under the voltage condition 2, the reflected electron in the angular range from 0° to $\beta°$ may be detected. The reflected electron in the angular range from $\alpha°$ to $\beta°$ may be detected by subtracting the image under the voltage condition 1 from the image under the voltage condition 2 to generate the difference image. If acquisition of the difference image in the detection angular range selected by the operator is required, the operator sets the detection angular range (S1201). Then the apparatus automatically sets the voltage and control parameters for the electrode under the voltage condition 1 (S1202, S1203). The acquired image is stored in the recording unit 37 (S1204). Thereafter, the voltage and control parameters of the electrode are changed to those under the voltage condition 2 (S1205, S1206). The acquired image is stored in the recording unit 37 (S1207). Then the control calculation unit 36 for the entire apparatus reads the images obtained under the voltage conditions 1 and 2 to generate the difference image between those two images (S1208). The resultant image is displayed on the monitor 38 (S1209). In this case, the difference is calculated using the image which contains both the low and high angular components. This method uses the high angular components contained in both images as offset, which may cause deterioration in accuracy of the image in generation of the difference image. It is preferable to generate the difference image by acquiring only the low angular components while removing the high angular components through application of the negative voltage to the energy filter for the purpose of avoiding the aforementioned problem.

Figure 5A:
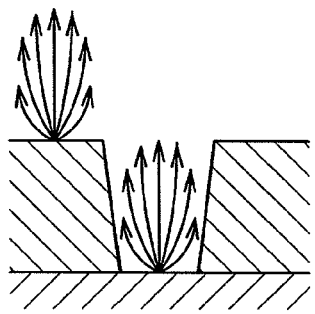
FIG. 5A is a view illustrating variable profiles in accordance with change in the obtained signal, representing orbits of the secondary electrons generated at the top part and the bottom part.
Figure 5B:
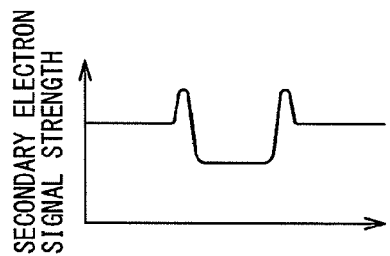
FIG. 5B is a view illustrating variable profiles in accordance with change in the obtained signal, representing the line profile derived from detecting the secondary electron signal.
Figure 5C:
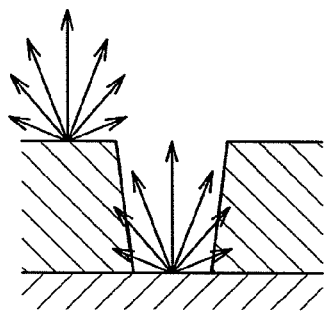
FIG. 5C is a view illustrating variable profiles in accordance with change in the obtained signal, representing orbits of the reflected electrons generated at the top part and the bottom part.
Figure 5D:
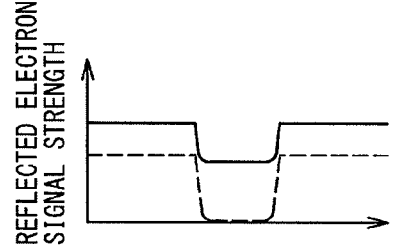
FIG. 5D is a view illustrating variable profiles in accordance with change in the obtained signal, representing the line profiles derived from detecting the reflected electron signals, and specifically, the solid line represents the line profile corresponding to the wide detection angle, and the dashed line represents the one corresponding to the detection angle that has been selected and narrowed.

The scanning electron microscope as shown in FIG. 1 is used for observing the sample with a hole having the sectional structure as shown in FIG. 5C while changing the elevation angle of the reflected electron. As a result, quality image is acquired.

This embodiment provides the scanning electron microscope capable of detecting the reflected electron at arbitrary emission angle in accordance with the shape and material of the sample.

Second Embodiment

A second embodiment will be described referring to FIG. 13. Unless otherwise specified, the matter described in the first embodiment is applicable to this embodiment even if it is not described therein.

Figure 13:
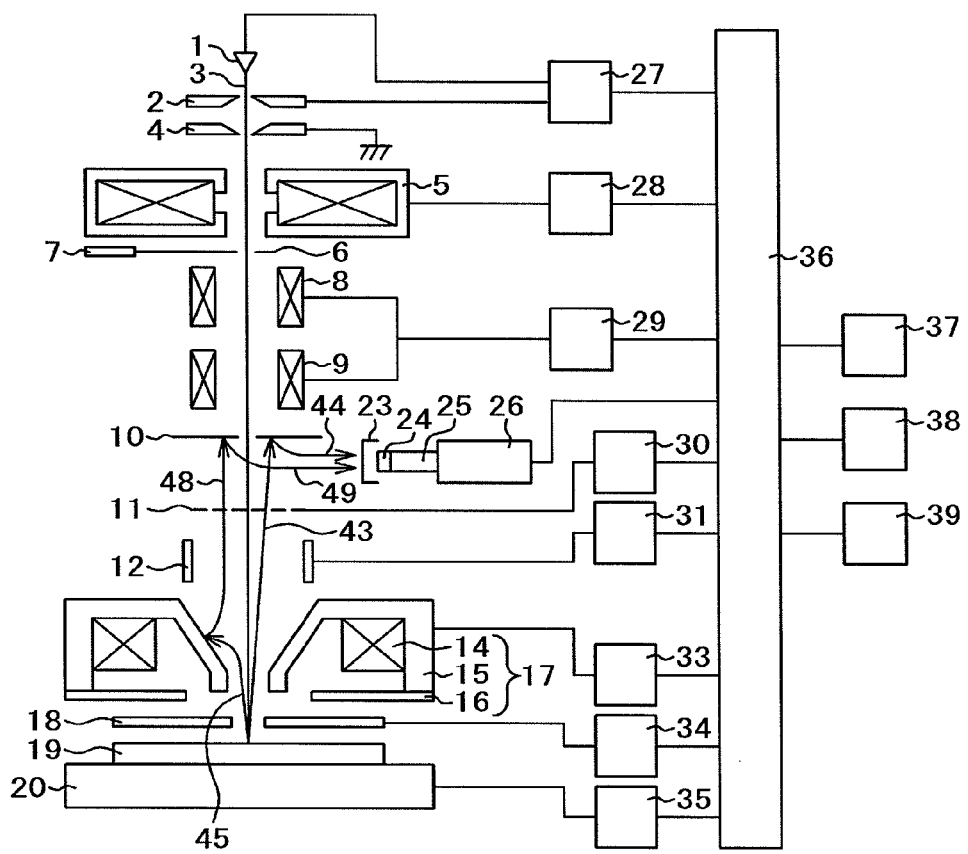
FIG. 13 is a schematic view of a scanning electron microscope according to a second embodiment.

FIG. 13 illustrates the entire structure that is the same as the one shown in FIG. 1 except that the secondary electron conversion electrode 13 for exclusive use is not provided. This structure allows the upper magnetic pole 15 of the objective lens 17 to serve as the secondary electron conversion electrode 13. The voltage is applied only to the upper magnetic pole 15 which is insulated from the lower magnetic pole 16 via space or an insulator interposed between those poles. The drawing shows orbits of the high and low angular components of the reflected electron. The low angular component 43 impinges on the electrode (conversion electrode) 10 likewise the case shown in FIGS. 3A and 3B to generate the secondary electron 44. The generated secondary electron 44 is sucked in the lateral electric field of the suction electrode 23, and detected. Meanwhile, the high angular component 45 impinges on the upper magnetic pole 15 of the objective lens 17 instead of the secondary electron conversion electrode to generate a secondary electron 48. The secondary electron 48 is withdrawn by the potential difference between the upper magnetic pole 15 of the objective lens 17 and the withdrawing electrode 12, and accelerated to impinge on the electrode (conversion electrode) 10. As a result, a secondary electron 49 is further generated. The generated secondary electron 49 is sucked in the lateral electric field of the suction electrode 23, and detected. It is necessary to set the voltage of the upper magnetic pole 15 to negative to bring the secondary electron apart from the magnetic pole, and shift the potential of the withdrawing electrode 12 to the electropositive side compared with that of the upper magnetic pole 15 for withdrawing in order to detect the high angular reflected electron 45 which impinges on the upper magnetic pole 15 of the objective lens 17. Therefore, the upper magnetic pole 15 of the objective lens 17 serves as the secondary electron conversion electrode in place thereof for the exclusive use, which is expected to provide the similar effects to those derived from the first embodiment through application of the negative voltage to the upper magnetic pole 15. The structure according to this embodiment may reduce the number of electrodes on the optical axis by one electrode compared with the structure shown in FIG. 1, thus suppressing the influence resulting from deterioration in the resolution owing to misalignment of the electrode center, and deterioration in detection rate of the reflected electron. The exclusive secondary electron conversion electrode is not provided to create the space in the apparatus, which makes it easy to change the shape of the withdrawing electrode and the mount position.

The scanning electron microscope as shown in FIG. 13 is used for observing the sample with a hole having the sectional structure as shown in FIG. 5C while changing the elevation angle of the reflected electron. As a result, quality image is acquired.

This embodiment provides the scanning electron microscope capable of detecting the reflected electron at arbitrary emission angle in accordance with the shape and material of the sample. Use of the upper magnetic pole of the objective lens as the secondary electron conversion electrode allows extra space in the apparatus, making it easy to change the shape and mount position of the withdrawing electrode.

Third Embodiment

Figure 14:
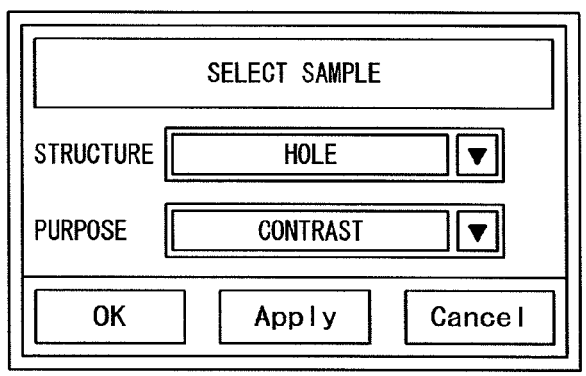
FIG. 14 is a view illustrating an example of a GUI for setting a sample structure and an observation target using a scanning electron microscope according to a third embodiment.

In the first embodiment, the angular range of the reflected electron is directly designated. However, it is possible to acquire the image by selecting the sample structure and the observation target. The operator does not necessarily understand how to acquire the image suitable for the observation, that is, the specific angular range of the image to provide the desired image. It is therefore preferable to present the observation mode for acquiring the suitable image only by designating the sample structure and the observation target. In this mode, the angular range suitable for observing the sample structure is stored in the control table 39 by the apparatus. Use of the table automatically provides the voltage applied to the electrode and control parameters such as the image pickup condition suitable for the sample structure and the observation target. FIG. 14 shows an example of the GUI, and FIG. 15 shows a flowchart of the process to be executed upon selection of the sample structure and the observation target via the GUI. The operator sets the sample structure and the observation target via the GUI (S1501). Then the apparatus automatically selects and sets the detection angular range suitable for the observation in reference to the control table 39 (S1502) so that the voltage and the control parameter of the voltage for satisfying the intended detection angular range are set (S1503, S1504). Thereafter, the image is acquired and stored in the recording unit 37 (S1505). Finally, the acquired image is displayed on the monitor 38 (S1506). The order of storage and display of the obtained image may be switched. Referring to FIG. 14, the "hole" and "contrast" are selected to detect only the high angular component. Then the acquired image shows the top part and the bottom part of the hole observed with the highest contrast. It is also possible to select the mode with not only the combination of the hole and contrast, but also the mode suitable for observing the bottom part structure, and the sample with different structure such as the nanoimprint and hard disk.

The scanning electron microscope as shown in FIG. 13 is used for observing the sample with a hole having the sectional structure as shown in FIG. 5C while changing the elevation angle of the reflected electron. As a result, quality image is acquired.

This embodiment provides the scanning electron microscope capable of detecting the reflected electron at arbitrary emission angle in accordance with the shape and material of the sample. Use of the control table which stores the angular range suitable for observing the sample structure makes it easy to observe the sample structure and to acquire the image in the suitable angular range.

Fourth Embodiment

Figure 17:
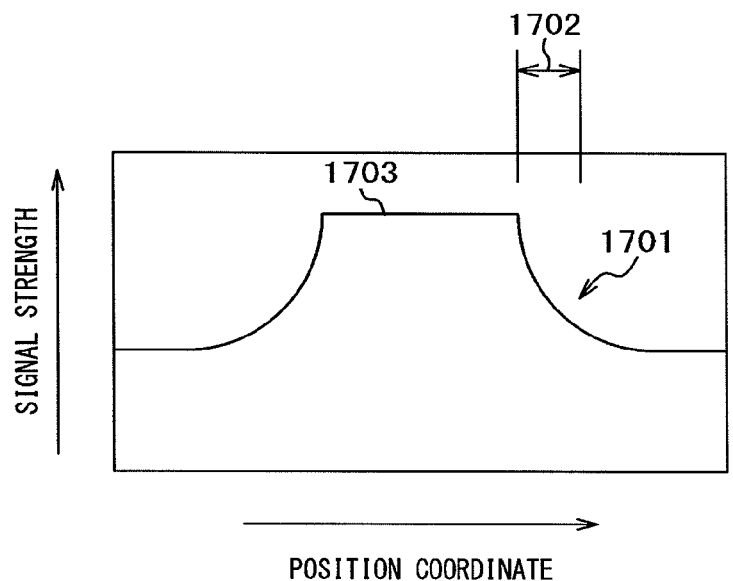
FIG. 17 represents a one-dimensional profile obtained by vertically integrating the observed images of the sample shown in FIGS. 16A and 16B.
Figure 18:
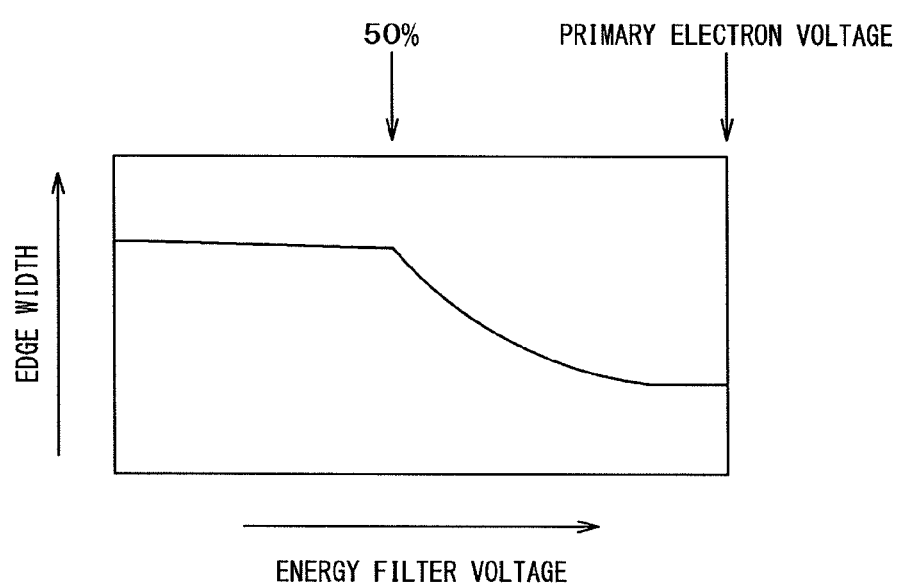
FIG. 18 is a view representing the relationship between the voltage applied to the energy filter and the edge width of the one-dimensional profile upon observation of the sample shown in FIGS. 16A and 16B.

In this embodiment, the sample with the structure as shown in FIGS. 16A and 16B is observed. The embodiment is configured to observe the electron beam at relatively high voltage to acquire the information on a trapezoidal shape 1601 inside the sample. FIG. 17 illustrates a one-dimensional profile 1703 obtained by vertically integrating the observed images. Because of the trapezoidal pattern, an edge width 1702 is generated at an edge portion 1701 of the profile. This width reflects the angle of the trapezoidal shape, and contains useful information. On the contrary, such information is unnecessary for obtaining a top width 1602 of the pattern. In this embodiment, the voltage is applied to the energy filter. FIG. 18 shows the relationship between the voltage applied to the energy filter and the edge width of the one-dimensional profile. This drawing shows that the edge width is reduced as the voltage applied to the energy filter becomes a half or higher than the acceleration voltage of the electron source. The reflected electron with relatively small energy loss, that is, relatively high energy is likely to reflect the information near the surface. Setting the voltage applied to the energy filter to a half or higher than the acceleration voltage allows acquisition only of the electron with relatively small energy loss. This allows the image acquisition process to be less influenced by the trapezoidal shape. The edge width may further be reduced by increasing the voltage of the filter for the primary electron to be in the range from 80% to 90%, indicating effectiveness of the technique.

The technique depends on the angle of the trapezoidal pattern. For example, in the case of large angle, application of high voltage is effective for measurement of the top width. Furthermore, both the trapezoidal angular information and the top width may be obtained by acquiring two images. For example, one image may be acquired by setting the voltage applied to the energy filter to 0, and the other image may be acquired by applying the high voltage. Generating the difference image between those two images is effective for evaluating the shape information.

FIG. 19 shows the interface of the apparatus to be operated, which illustrates the screen that appears after inputting the trapezoidal information inside the sample to display the voltage value applied to the energy filter as the candidate. The user is allowed to use the candidate value or manually set the voltage value.

Provided are the modes for carrying out the present invention that has been explained above.

(1) The scanning electron microscope which acquires an image by detecting an electron emitted from a sample irradiated with a primary electron beam using a detector includes:
an electron source;
an objective lens for converging the primary electron beam emitted from the electron source on the sample;
a control electrode disposed between the objective lens and the sample;
a secondary electron conversion electrode disposed between the objective lens and the detector to generate a secondary electron by impingement of the reflected electron;
a withdrawing electrode that withdraws the secondary electron upward;
an energy filter; and
a control calculation unit which selects a combination of voltages applied to the secondary electron conversion electrode, the withdrawing electrode, and the energy filter.

(2) The scanning electron microscope includes:
an electron source;
an objective lens for converging a primary electron beam emitted from the electron source onto a sample;
a control electrode disposed between the objective lens and the sample for discriminating between a secondary electron and a reflected electron which are emitted from the sample irradiated with the primary electron beam;
an upper magnetic pole serving as a secondary electron conversion electrode, which constitutes a part of the objective lens and generates the secondary electron by the impact of the reflected electron;
a withdrawing electrode for withdrawing the secondary electron generated from the upper magnetic pole serving as the secondary electron conversion electrode;
an energy filter disposed above the withdrawing electrode for discriminating between the secondary electron generated from the upper magnetic pole serving as the secondary electron conversion electrode and the reflected electron emitted from the sample; and
a control calculation unit for controlling voltages applied to the upper magnetic pole serving as the secondary electron conversion electrode, the withdrawing electrode, and the energy filter.

The present invention is not limited to the embodiments as described above, and may include various modifications. The embodiments have been described in detail for better understanding of the invention, and are not necessarily restricted to the one provided with all the structures of the description. The structure of any one of the embodiments may be partially replaced with that of the other embodiment. Alternatively, it is possible to add the structure of any one of the embodiments to that of the other embodiment. It is also possible to have the part of the structure of the respective embodiments added to, removed form and replaced with the other structure.

REFERENCE SIGNS LIST

1 ... field emission cathode, 2 ... extraction electrode, 3 ... emitted electron, 4 ... anode, 5 ... condenser lens, 6 ... diaphragm, 7 ... adjustment knob, 8 ... upper scanning deflector, 9 ... lower scanning deflector, 10 ... electrode (conversion electrode), 11 ... energy filter, 12 ... withdrawing electrode, 13 ... secondary electron conversion electrode, 14 ... objective lens coil, 15 ... upper magnetic pole, 16 ... lower magnetic pole, 17 ... objective lens, 18 ... control electrode, 19 ... sample, 20 ... sample holder, 21 ... secondary electron and reflected electron, 22 ... secondary electron, 23 ... suction electrode, 24 ... scintillator, 25 ... light guide, 26 ... photomultiplier, 27 ... electron gun control unit, 28 ... condenser lens control unit, 29 ... scanning deflector control unit, 30 ... energy filter control unit, 31 ... withdrawing electrode control unit, 32 ... secondary electron conversion electrode control unit, 33 ... objective lens control unit, 34 ... control electrode control unit, 35 ... sample voltage control unit, 36 ... control calculation unit for entire apparatus, 37 ... recording unit, 38 ... monitor, 39 ... control table, 40 ... secondary electron, 41 ... reflected electron, 42 ... secondary electron returned to the sample, 43 ... low angular reflective electron, 44 ... secondary electron generated by the low angular reflected electron that impinges on the electrode (conversion electrode) 10, 45 ... high angular reflected electron, 46 ... secondary electron generated by the high angular reflected electron that impinges on the secondary electron conversion electrode 13, 47 ... secondary electron generated by the secondary electron 46 that impinges on the electrode (conversion electrode) 10, 48 ... secondary electron generated by the high angular reflected electron on the upper magnetic pole of the objective lens, 49 ... secondary electron generated by the secondary electron 48 that impinges on the electrode (conversion electrode) 10, 1601 ... trapezoidal shape, 1602 ... top width, 1701 ... edge portion, 1702 ... edge width, 1703 ... one-dimensional profile

The invention claimed is:

1. A scanning electron microscope which acquires an image by detecting an electron emitted from a sample irradiated with a primary electron beam using a detector, comprising:
an electron source;
an objective lens for converging the primary electron beam emitted from the electron source on the sample;
a control electrode disposed between the objective lens and the sample;
a secondary electron conversion electrode disposed between the objective lens and the detector to generate a secondary electron by impingement of the reflected electron;
a withdrawing electrode that withdraws the secondary electron upward;
an energy filter; and
a control calculation unit which selects a combination of voltages applied to the secondary electron conversion electrode, the withdrawing electrode, and the energy filter.

2. The scanning electron microscope according to claim 1, wherein the control calculation unit automatically selects a predetermined voltage value based on information about a detection angular range of the reflected electron emitted from the sample.

3. The scanning electron microscope according to claim 2, wherein the information is selected from multiple predetermined detection angular ranges.

4. The scanning electron microscope according to claim 1, wherein the control calculation unit automatically selects a control parameter of corresponding image pickup condition based on the information selected from the multiple predetermined detection angular ranges of the reflected electron emitted from the sample.

5. The scanning electron microscope according to claim 4, wherein the calculation control unit automatically selects the detection angular range suitable for observation based on the information about the sample to be observed.

6. The scanning electron microscope according to claim 1, wherein an upper magnetic pole of the objective lens serves as the secondary electron conversion electrode.

7. The scanning electron microscope according to claim 1, wherein the control calculation unit automatically acquires two images derived at two different voltages applied to the energy filter based on the information about the detection angular range of the reflected electron emitted from the sample, and generates a difference image between those images.

8. The scanning electron microscope according to claim 7, wherein upon acquisition of one of the two images, the voltage applied to the energy filter is set to be lower than the voltage applied to the secondary electron conversion electrode.

9. The scanning electron microscope according to claim 1, wherein the control calculation unit automatically acquires images under a condition of combining multiple voltages based on the information about detection angular range of the reflected electron emitted from the sample, and generates a difference image between the images.

10. The scanning electron microscope according to claim 1, wherein the angular range of the detectable reflected electron is widened by increasing a potential difference between the secondary electron conversion electrode and the withdrawing electrode.

11. The scanning electron microscope according to claim 1, wherein the reflected electron at a high angle from the sample is obtained by decreasing incident energy of the primary electron beam to the sample.

12. The scanning electron microscope according to claim 1, wherein:
the sample is a magnetic head; and
the voltage of the control electrode is set to a negative side compared with the sample.

13. The scanning electron microscope according to claim 1, wherein a potential of the secondary electron conversion electrode is set to be negative.

14. The scanning electron microscope according to claim 1, wherein a potential of the withdrawing electrode is set to a relatively positive side compared with the potential of the secondary electron conversion electrode.

15. The scanning electron microscope according to claim 1, wherein application of the voltage higher than a half of an acceleration voltage of the electron source to the energy filter is allowed.

16. The scanning electron microscope according to claim 1, wherein the voltage applied to the energy filter can be selected based on the information about an inner shape of the sample.

17. The scanning electron microscope according to claim 1, wherein the control calculation unit acquires two images derived at different voltages applied to the energy filter to generate a difference image between the two images based on the information about the inner shape of the sample.

18. A scanning electron microscope comprising:
an electron source;
an objective lens for converging a primary electron beam emitted from the electron source onto a sample;
a control electrode disposed between the objective lens and the sample for discriminating between a secondary electron and a reflected electron which are emitted from the sample irradiated with the primary electron beam;
an upper magnetic pole serving as a secondary electron conversion electrode, which constitutes a part of the objective lens and generates the secondary electron by an impact of the reflected electron;
a withdrawing electrode for withdrawing the secondary electron generated from the upper magnetic pole serving as the secondary electron conversion electrode;
an energy filter disposed above the withdrawing electrode for discriminating between the secondary electron generated from the upper magnetic pole serving as the secondary electron conversion electrode and the reflected electron emitted from the sample; and
a control calculation unit for controlling voltages applied to the upper magnetic pole serving as the secondary electron conversion electrode, the withdrawing electrode, and the energy filter.

* * * * *